United States Patent [19]

Harris et al.

[11] Patent Number: 5,517,136

[45] Date of Patent: May 14, 1996

[54] OPPORTUNISTIC TIME-BORROWING DOMINO LOGIC

[75] Inventors: David Harris, Santa Clara; Sunny C. Huang, Cupertino; James Nadir, San Jose; Ching-Hua Chu, San Jose; Jason C. Stinson, Mountain View; Alper Ilkbahar, Santa Cruz, all of Calif.

[73] Assignee: Intel Corporation, Santa Clara, Calif.

[21] Appl. No.: 398,123

[22] Filed: Mar. 3, 1995

[51] Int. Cl.⁶ .................................. H03K 19/017
[52] U.S. Cl. .................... 326/93; 326/17; 326/97
[58] Field of Search ................ 326/17, 93, 96–98

[56] References Cited

U.S. PATENT DOCUMENTS

| | | | |
|---|---|---|---|
| 4,568,842 | 2/1986 | Koike | 307/279 |
| 4,700,086 | 10/1987 | Ling et al. | 307/443 |
| 4,841,174 | 6/1989 | Chung et al. | 307/469 |
| 4,893,034 | 1/1990 | Tamuru | 307/480 |
| 4,929,850 | 5/1990 | Breuninger | 307/272.1 |
| 5,121,003 | 6/1992 | Williams | 307/452 |
| 5,189,319 | 2/1993 | Fung et al. | 307/425 |
| 5,208,489 | 5/1993 | Houston | 307/451 |
| 5,208,490 | 5/1993 | Yetter | 307/452 |
| 5,343,090 | 8/1994 | Proebsting | 307/443 |
| 5,369,621 | 11/1994 | Mason | 326/106 |
| 5,392,423 | 2/1995 | Yetter | 395/550 |
| 5,402,012 | 3/1995 | Thomas | 326/97 |
| 5,434,520 | 7/1995 | Yetter et al. | 326/93 |
| 5,453,708 | 9/1995 | Gupta et al. | 326/98 |

OTHER PUBLICATIONS

"The Metaflow Architecture", by Val Popescu, Merle Schultz, John Spracklen, Gary Gibson, Bruce Lightner, David Isaman, IEEE Micro. 1991.

*Primary Examiner*—David R. Hudspeth
*Attorney, Agent, or Firm*—Blakely, Sokoloff, Taylor & Zafman

[57] ABSTRACT

An opportunistic time-borrowing domino logic includes a domino pipeline having a plurality of logic gates coupled in series and controlled by first, second, third and fourth clock signals. The first domino gate in a half-cycle is clocked by either the first or the second clock signals, wherein the last domino gate in a half-cycle is clocked by either the third or the fourth clock cycles. The second clock signal is an inverse of the first clock signal, and the third and fourth clock signals have local delayed clock phases in which the falling edges of the third and fourth clock signals are delayed relative to the falling edges of the respective first and second clock signals. In a first half-cycle, a first type of domino gate is controlled by the first clock signal, with subsequent domino gates of the same type being controlled by the third clock signal. Odd-numbered half-cycles begin with a domino gate of the second type controlled by the second clock signal, followed by domino gates of the first type controlled by the fourth clock signal.

34 Claims, 5 Drawing Sheets

FIG_1 (PRIOR ART)

FIG_2

FIG_3

NORMAL SKEW

FIG_4A

HIGH SKEW

FIG_4B

FIG_5

FIG_6

FIG_7

FIG_8

FIG_9A

FIG_9B

FIG_10A

FIG_10B 5,517,136

OPPORTUNISTIC TIME-BORROWING DOMINO LOGIC

FIELD OF THE INVENTION

The present invention relates to the field of digital electronic circuits; more particularly, to logic circuits designed for high-speed synchronous operation.

BACKGROUND OF THE INVENTION

Advances in semiconductor fabrication and manufacturing technologies have allowed circuit designers to integrate tremendous numbers of transistors on a single die. For instance, modern integrated circuits (ICs) commonly include several million transistors interconnected on a single semiconductor substrate. Innovations in semiconductor process technology have also made it possible for designers to consider new ways of implementing basic circuit functions, alternatives to existing logic structures, and microarchitectural changes to further improve performance.

One approach that researchers and scientists have investigated for improving performance is to aggressively raise the clock frequency at which the device operates. Of course, raising clock frequencies means that fewer logic gate delays are permitted within each clock cycle. For example, whereas previously architects could easily design logic circuits having twenty complementary metal-oxide semiconductor (CMOS) gate delays in a single clock cycle; today's frequencies are so high that there is scarcely time for a signal to propagate through eight gates before the next cycle begins. Because operating frequency target speeds are now an order of a magnitude higher than they were just a few years ago, static CMOS circuit designs no longer suffice for crucial speed paths.

One innovation in circuit design methodology has been the development of so-called domino and cascode voltage switch logic circuits. Domino logic circuits attempt to increase speed performance by electrically precharging a series of logic gates during a first clock phase, and then evaluating the intended logic function during the next clock phase. The critical speed path is pipelined in domino logic so that a portion of the domino gates are precharging while another portion are evaluating. Examples of CMOS domino logic circuits can be found in U.S. Pat. Nos. 4,700,086 and 5,369,621. Various techniques for enhancing speed performance in CMOS domino logic circuits are described in U.S. Pat. Nos. 5,121,003; 5,208,490 and 5,343,090.

Despite improving gate performance, basic domino circuit methods still suffer from two serious weaknesses. The first problem involves the time required to precharge sets of logic gates. In traditional domino circuits, the critical path is divided into half-cycles; wherein during one half-cycle the gates are precharging, and in the other half-cycle they are evaluating. Past approaches have used latches to decouple the precharge phase from the evaluation phase. Including latches in the critical path, however, burdens the critical path with a significant time delay. By way of example, in a critical path which comprises eight logic gate delays, two latches might be required per clock cycle. This means that at least 25% of the entire cycle time is wasted doing no logical work.

A second drawback of existing domino logic circuit designs is known as the clock boundary problem. Presently, it is very difficult to borrow time across clock phase boundaries. Time-borrowing refers to the idea of using time available from one half-cycle, in another half-cycle. For example, if one clock cycle takes longer to complete than expected, and another clock cycle completes in a shorter time than expected, it is desirable to be able to borrow some of the time available from the short cycle for use in the longer cycle. Traditional domino logic designs are incapable of borrowing time since they must complete before a latch closes at the end of a half-cycle. Moreover, if a given half-cycle completes early, there still may be wasted time at the end of that half-cycle which is too short to fit in a full gate delay. Balancing the circuit pipeline in such situations has proved to be very difficult.

Furthermore, there frequently is more wasted time in the final silicon circuit than can be reliably predicted by simulation or modeling. This wasted time arises from a variety of sources such as process variations, modeling limitations, temperature fluctuations, etc. It is highly desirable to take advantage of this wasted time by making it available for use in cycles that need it most. If a CMOS domino circuit could opportunistically borrow this wasted time for longer half-cycles, higher frequency operation would be possible.

As will be seen, the present invention provides an opportunistic time-borrowing domino logic based on a global methodology that solves the precharge and clock boundary problems. The invention yields high-performance domino logic circuits with automatic borrowing of time that might be left over from a previous clock cycle. The time-borrowing is truly opportunistic since it occurs without special effort or without special knowledge on the part of the designer or user.

SUMMARY OF THE INVENTION

This invention is an opportunistic time-borrowing domino logic that achieves higher clock frequencies with lower power consumption and clock loading. The domino circuitry in the present invention is also less sensitive to clock skew and produces a high yield at fixed operating frequencies.

In one embodiment, the invention is a complementary metal-oxide semiconductor (CMOS) domino logic which achieves enhanced speed performance by eliminating latches in the critical speed path and opportunistically time-borrowing across clock boundaries. The present invention comprises a domino pipeline including a plurality of logic gates controlled by first, second, third and fourth clock signals. The logic gates are coupled in series and grouped according to half-cycles. The first domino gate in a half-cycle is clocked by either the first or the second clock signals, wherein the last domino gate in a half-cycle is clocked by either the third or the fourth clock cycles.

The first clock signal is a standard clock signal having an approximate 50% duty cycle. The second clock signal is an inverse of the first clock signal. The third and fourth clock signals have local delayed clock phases. That is, the third and fourth clock signals have rising edges substantially synchronous with rising edges of the first and second clock signals. But the falling edges of the third and fourth clock signals are delayed relative to the falling edges of the respective first and second clock signals. The clock phases are arranged such that the precharge edge is delayed in a way that allows evaluation to continue into the subsequent half-cycle, thereby accomplishing forward time-borrowing.

Two different types of domino gates are utilized in the described embodiments. In a first half-cycle the domino pipeline comprises a first type of domino gate controlled by the first clock signal. This first type of domino gate is followed by one or more domino gates of the same type controlled by the third clock signal. Subsequent odd-numbered half-cycles begin with a first domino gate of the second type, which is controlled by the second clock signal. The first domino gate of the second type is followed by one or more domino gates of the first type. These latter gates are controlled by the fourth clock signal. Interposed between successive domino gates are inverting, so-called "high skew" gates capable of rapidly making low-to-high transitions during the evaluation phase.

The second type of logic gate eliminates a single latch from the middle of the pipeline stage so as to boost maximum clock frequency. When multiple pipeline stages are cascaded, the domino logic of the present invention eliminates latches between stages, as well as latches in the middle of each stage. This feature of the invention provides enhanced frequency operation over long circuit paths. In addition, opportunistic time-borrowing further improves performance by compensating for poorly balanced pipelines and by amortizing the effect of clock skew over multiple cycles.

BRIEF DESCRIPTION OF THE DRAWINGS

The present invention will be understood more fully from the detailed description which follows and from the accompanying drawings, which however, should not be taken to limit the invention to the specific embodiments shown, but rather are for explanation and understanding only.

DETAILED DESCRIPTION

The present invention is an innovative CMOS domino logic and methodology. The opportunistic time-borrowing domino logic of the present invention utilizes two primary mechanisms to achieve great performance gains: (1) the elimination of latches in the domino pipeline and (2) opportunistic time-borrowing. In the following description, numerous specific details are set forth, such as particular timing relationships, circuit types, interconnections, etc., in order to provide a thorough understanding of the present invention. It should be understood, however, that these specific details need not be used to practice the present invention. In other instances, well known structures, circuits, layouts, etc., have not been shown or discussed in detail in order to avoid obscuring the invention.

Types Of Domino Logic Gates

Figure 1:
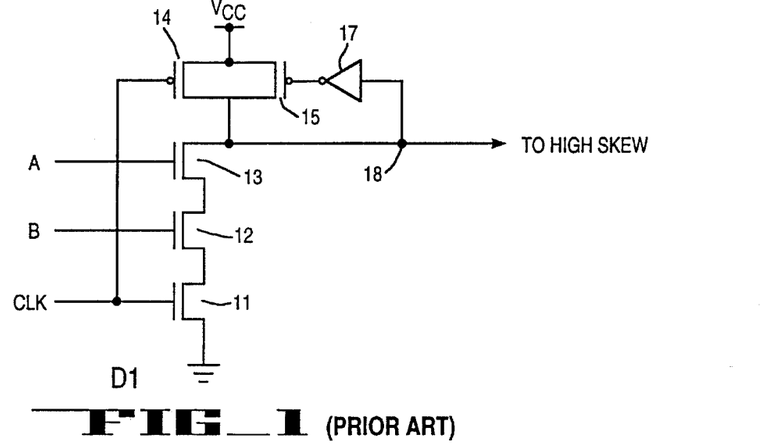
FIG. 1 is a circuit schematic diagram of a prior art domino logic gate.

Referring now to FIG. 1, there is shown a prior art domino NAND gate D1 comprising n-channel field-effect transistors (NFETs) 11–13 coupled in series between output node 18 and ground. The prior art D1 gate represents a standard logic gate utilized in many CMOS domino designs. The logic gate of FIG. 1 further comprises a pair of p-channel field-effect transistors (PFETs) 14 and 15 coupled in parallel between operating supply potential $V_{CC}$ and output node 18. The gate of PFET 14 is coupled to the gate of NFET 18 to receive the input clock signal CLK. Data inputs A and B are shown coupled to the gates of transistors 13 and 12, respectively. An inverter 17, having its input coupled to output node 18 and its output coupled to the gate of PFET 15, is employed to latch the output data at node 18. FIG. 1 also indicates that output node 18 is coupled to the input of a high skew inverting CMOS gate.

During normal operation, when clock signal CLK rises, but either of inputs A or B remain low, the logical output signal at output node 18 remains high. In this situation, PFET 15 prevents output node 18 from floating. The drawback of the gate D1, however, is that if gate D1 evaluates low, and then either input A or B returns low, the output floats at a low value. If left floating indefinitely, the low output value could become corrupted.

Figure 2:
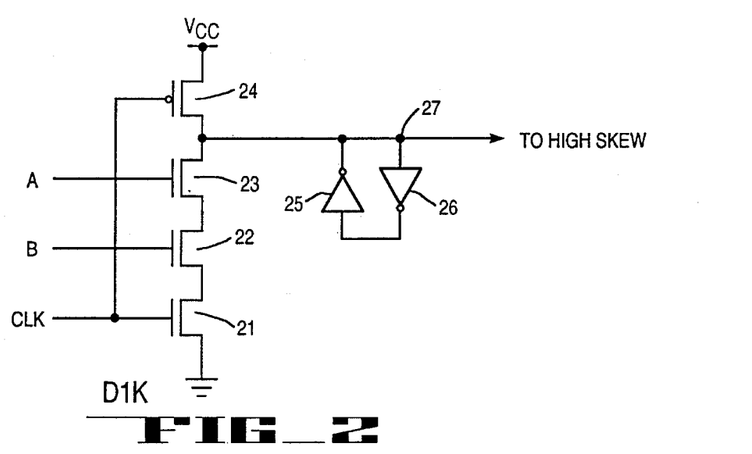
FIG. 2 is a circuit schematic diagram of a domino gate in accordance with the present invention.

FIG. 2 illustrates a novel CMOS domino logic gate utilized in the present invention which solves the problem inherent in the D1 gate. The D1K gate shown in FIG. 2 is somewhat similar to the D1 gate in that it includes NFET transistors 21–23 coupled in series between an output node 27 and ground. A PFET transistor 24 is coupled between operating supply potential $V_{CC}$ and output node 27. The gates of transistors 23 and 22 are coupled to receive input data signals A and B, with a clock signal CLK being coupled to the gates of NFET 21 and PFET 24.

The D1K logic gate of FIG. 2 also includes a pair of inverters 25 and 26 coupled in a series ring to output node 27. Due to this modification, the output logic value no longer floats at low input data and clock values. As will be discussed in more detail shortly, utilizing D1K gates in accordance with the present invention obviates the need for latches in the critical speed path since they are fully static, and retain their value even the clock is stopped. By eliminating latches in the domino chain, propagation delays are greatly reduced.

To provide opportunistic time-borrowing, the domino logic gates should be capable of evaluating as soon as their inputs are ready. To achieve this result, the methodology of the present invention automatically allows a slow stage to borrow from the time normally allocated to a faster stage. This means that the opportunistic time-borrowing scheme of the present invention can be either backward (i.e., borrowing time from a previous stage that finishes early) or forward (i.e., borrowing time by running into the subsequent fast stage). The opportunistic time-borrowing domino logic of the present invention is designed to be either backward or forward borrowing. (The embodiments described below illustrate forward borrowing only; however, it should be understood that either forward or backward borrowing may be implemented in accordance with the present invention.)

It should be further understood that borrowing can accumulate over many stages; for example, if stage 1 is slow, stages 2–4 are normal, and stage 5 is fast, forward borrowing allows the entire pipeline to run at target frequency since stage 1 may borrow from stage 2, stage 2 finishes late and borrows from stage 3, and so forth until stage 4 finally borrows from stage 5, which is fast and hence can complete on time.

Clocking Scheme Of The Present Invention

Figure 3:
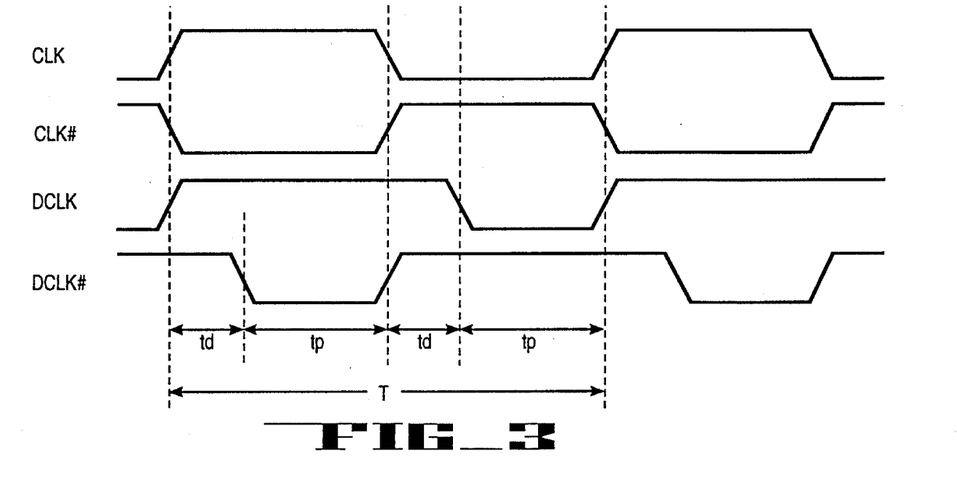
FIG. 3 is a timing waveform diagram which illustrates the various clock phases utilized in the domino logic of the present invention.

Referring now to FIG. 3 there is shown a timing waveform diagram of the clock signals utilized in the domino pipeline of the present invention. The clock signal CLK is a standard clock signal having a 50% duty signal. A typical frequency of the CLK signal might be 500 MHz. The CLK signal may comprise an integrated circuit's global reference clock signal, which runs at the chip's internal operating frequency. In FIG. 3 the period of the CLK signal is shown denoted as time T. Other clock phases are designed to nominally cross transitions in alignment with the CLK signal. (Note that dashed vertical lines are used to indicate boundaries between phases delineated by transitions of the various clock signals).

A second clock signal shown in FIG. 3 is labeled CLK# which is simply the complement of clock signal CLK.

The clocking scheme of the present invention further includes two clock signals, DCLK and DCLK#, having delayed clock phases. As can be seen, the DCLK and DCLK# signals both have rising edges which are substantially synchronous with the rising edges of signals CLK and CLK#, respectively. However, the falling edges of signals DCLK and DCLK# are delayed with respect to the falling edges of corresponding signals CLK and CLK#. In FIG. 3 the time delay between the falling edge of either CLK and DCLK, or CLK# and DCLK#, is denoted $t_d$.

The reason why the phases of DCLK and DCLK# have their precharge edge delayed is so that evaluation can continue into subsequent half-cycles to accomplish forward time-borrowing. The precharge time is shown in FIG. 3 as $t_p$, and a half-cycle is equal by the sum of $t_d$ and $t_p$. The full period T of any of the four clock waveforms can be represented mathematically by the following equation.

$$T=2(t_d+t_p)$$

The various clock signals illustrated in FIG. 3 may be generated by a local reference CLK circuit driven by the chip's global reference clock signal. In other words, whereas the global reference clock signal is provided over the entire chip, the clock phases shown in FIG. 3 are generated by a local clock generator over a limited die area, i.e., localized to the immediate vicinity of the domino pipeline circuitry. According to the domino logic methodology of the present invention, the time delay $t_d$ should be greater or equal to the hold time of the domino logic gate plus any global clock skew.

Figure 13:
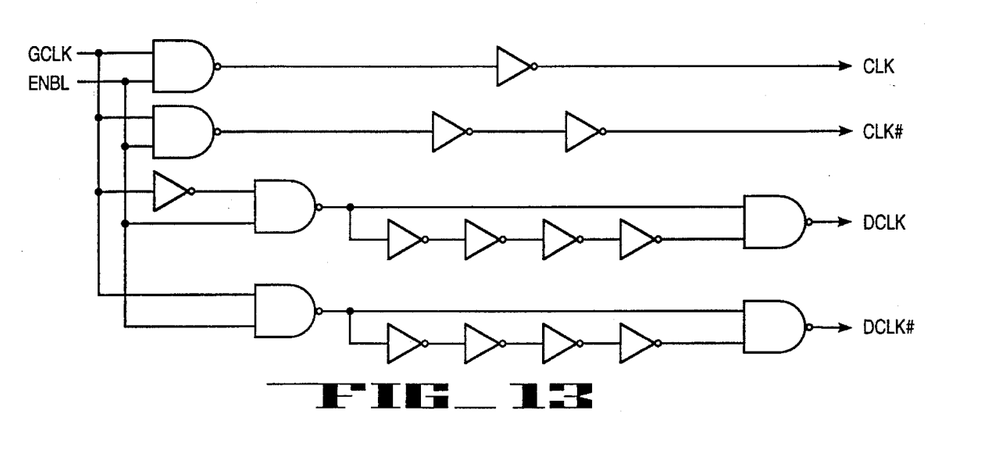
FIG. 13 illustrates one implementation of a local clock generator which provides clock signals in accordance with the present invention.

FIG. 13 is a logic block diagram illustrating one possible circuit implementation of a local clock generator. The global reference clock signal (GCLK) and an enable signal (ENBL) are shown provided as inputs, with the CLK, CLK#, DCLK and DCLK# clock phases being generated as outputs. Practitioners in the art will readily comprehend the operation of the circuit of FIG. 13. Of course, many other different local clock generator circuit implementations are possible in accordance with the present invention.

An Opportunistic Time-Borrowing Pipeline Example

Figure 5:
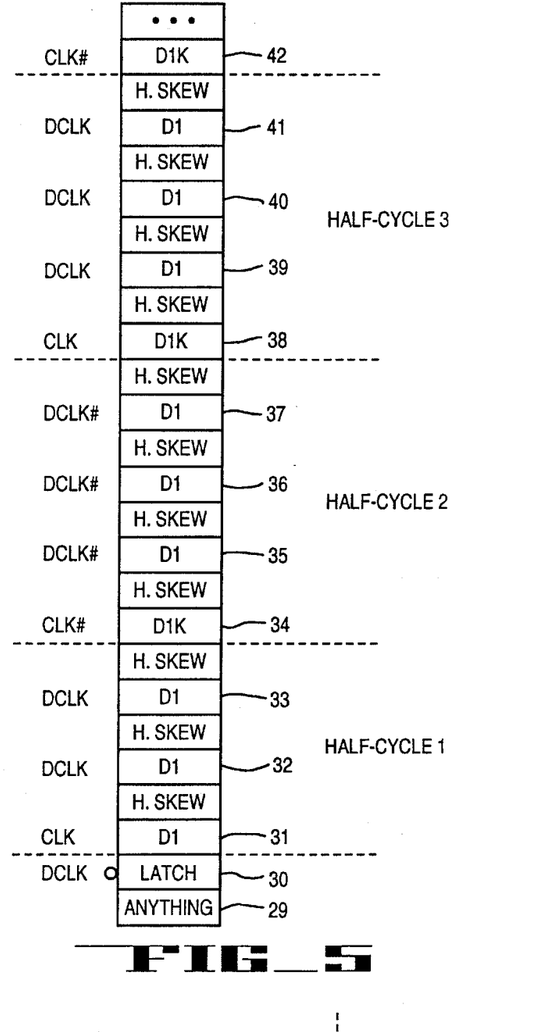
FIG. 5 is an example of a domino pipeline in accordance with one embodiment of the present invention.

Referring now to FIG. 5, an opportunistic time-borrowing pipeline example is shown in accordance with one embodiment of the present invention. The domino pipeline comprises domino logic gates 31–42 coupled in series. Interposed between adjacent domino gates is an inverting high skew CMOS logic gate. (Note that signal propagation in FIGS. 5, 7, 9A, 10A, 11 and 12 is from the bottom of the page to the top.)

Figure 4A:
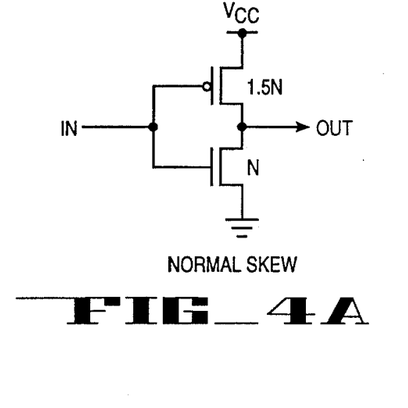
FIG. 4A and 4B are examples of CMOS circuits with normal and high skews, respectively.
Figure 4B:
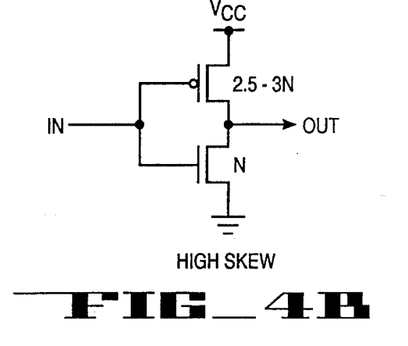

Examples of normal skew and high skew logic gates are shown in FIGS. 4A and 4B, respectively. FIG. 4A is a simple CMOS inverter in which the n-channel device has a dimension N and a p-channel device has a dimension of approximately 1.5N. The high skew device of FIG. 4B is also an inverting CMOS gate; however, the dimension of the p-channel device is larger than that shown in FIG. 4A, ranging from approximately 2.5N to 3N. The larger p-channel device dimension of the high skew gate shown in FIG. 4B provides rapid low-to-high transitions.

Referring once again to FIG. 5, the input to the domino chain arrives via a latch 30 which receives a data signal from earlier circuitry 29. The various clock phases coupled to each of logic devices 30–42 are illustrated at the top of each gate. The domino pipeline example of FIG. 5 is structured such that each domino gate is followed by a high skew CMOS gate. In the domino pipeline, when the output of a domino gate falls low, the output rises of the high skew gate which follows; this causes the next domino gate to be triggered, and so on, just as one domino tips over the next.

Figure 6:
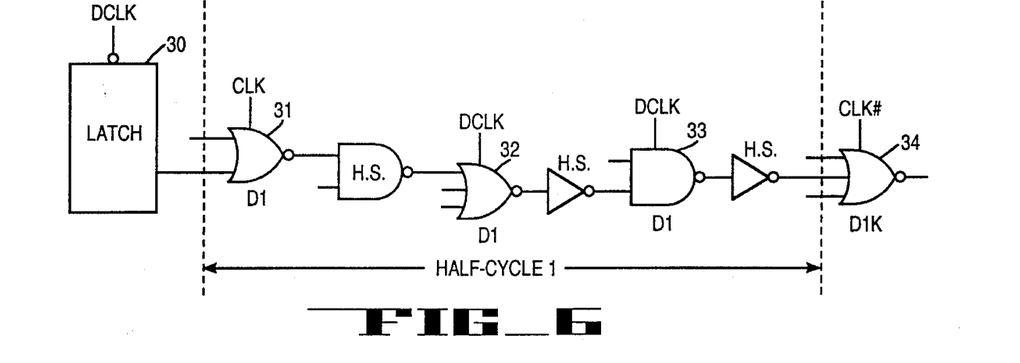
FIG. 6 is a circuit diagram illustrating an example of various logic gates that may be used to implement the pipeline example of FIG. 5.

FIG. 6 is a logic block diagram illustrating one possible implementation of the pipeline example shown in FIG. 5. Nominally, half-cycle 1 and half-cycle 3 evaluate when CLK is high, and half-cycle 2 evaluates on CLK low. Assuming that the left-most inputs come from static CMOS circuitry, or some other potentially glitchy source, the first half-cycle begins evaluation on CLK to filter glitches from latch 30. Subsequent domino gates evaluate on DCLK so that they can borrow time from the second half-cycle if needed. For example, in FIG. 5 domino gates 31 and 38 are shown being controlled by clock signal CLK. Domino gates 32 and 33 in half-cycle 1, and gates 39, 40 and 41 in half-cycle 3, are controlled by the delayed clock signal DCLK. Since DCLK has a delayed falling edge, gate 33 remains active high in evaluation when gate 34 begins evaluating in half-cycle 2. In other words, there is a time overlap that allows the second half-cycle to begin evaluating prior to the falling edge of the first half-cycle stage.

The first domino gate 34 in half-cycle 2 is controlled by clock signal CLK#. The remaining domino gates 35, 36 and 37 are controlled by a delayed inverted clock signal DCLK#. Half-cycle 2 beings with a CLK# controlled D1K gate 34. The CLK# signal is used instead of DCLK# to prevent very fast evaluations from rippling through the entire pipeline during the time that CLK, DCLK and DCLK# are all high.

The D1K domino gate is utilized as the first gate in half-cycle 2 because it retains its output value even after half-cycle 1 precharges. As discussed previously, the D1K gate obviates the need for latches at the input to reduce the time delay through the domino stage. Remaining gates in half-cycle 2 (i.e., gates 35–37) are controlled by DCLK# to support time-borrowing.

To better understand the concept of time-borrowing, suppose that the circuit path in half-cycle 1 takes longer than expected. That is, instead of having finished evaluating at the rising edge of CLK#, it actually finishes evaluating late. In accordance with the present invention, time is opportunistically borrowed for the next half-cycle (i.e., half-cycle 2) by virtue of the delayed falling edge of DCLK. All that has to happen in the examples of FIGS. 5 is that NAND gate 33 finish evaluating before the falling edge of DCLK. In this way the clocking scheme of the present invention trades off precharging performance to achieve time-borrowing for the remaining logic gates. Note that as long as time $t_p$ is sufficiently long to adequately precharge the logic gates in a given half-cycle, the domino logic pipeline functions properly.

Half-cycle 3 is similar to half-cycle 2, but the first domino gate (gate 31) is controlled by CLK to prevent signal race-through. Later in the half-cycle, DCLK type domino gates are utilized for time-borrowing. Practitioners familiar with logic circuits will understand that opportunistic time-borrowing in accordance with the present invention alleviates the impact of clock skew by allowing a stage suffering from maximum skew to borrow time from a subsequent stage having zero or negative skew. Opportunistic time-borrowing further improves circuit performance by compensating for poorly balanced pipelines and amortizing the effect of clock skew over multiple cycles. Furthermore, the domino logic of the present invention maximizes performance on long pipelines. The reason for this is because a larger fraction of the latches in the critical path can be eliminated, and time can be borrowed across more stage. Consequently, it is advantageous to construct long pipelines of the opportunistic time-borrowing domino logic of the present invention. Moreover, the logic of the present invention is superior in performance and power to standard domino chains.

General Guidelines For The Domino Logic

To provide a thorough understanding of the domino logic and methodology of the present invention, several important guidelines are discussed.

First, in order to prevent race-through the first domino gate in a half-cycle should be clocked with either CLK or CLK#. Note that controlling the first gate in the chain with CLK or CLK# does not impact time-borrowing since there is never a need to borrow through the first stage.

Second, in order to avoid minimum delay problems, there should be an overlap time from when the (N+1)th half-cycle begins evaluating until the Nth half-cycle begins precharging. To assure this result, the last domino gate in a half-cycle should be clocked with either DCLK or DCLK#. Furthermore, if any input to a domino gate comes from a domino gate in a previous half-cycle, then all other inputs in series with this input should come from either a domino gate or a static latch in the previous half-cycle. For example, consider the domino gate shown in FIG. 2. If input A is produced from a domino gate in the previous half-cycle, input B should also come from the previous half-cycle. Otherwise, if input B arrived late in the current half-cycle, input A might have already precharged and the domino gate would fail to evaluate. Sometimes logic may dictate that signal A comes from the previous half-cycle, while signal B comes from the present half-cycle. One possible implementation workaround is to place a D1K domino buffer controlled by the present half-cycle before input A. This guarantees that input A will not precharge at the wrong time.

Figure 7:
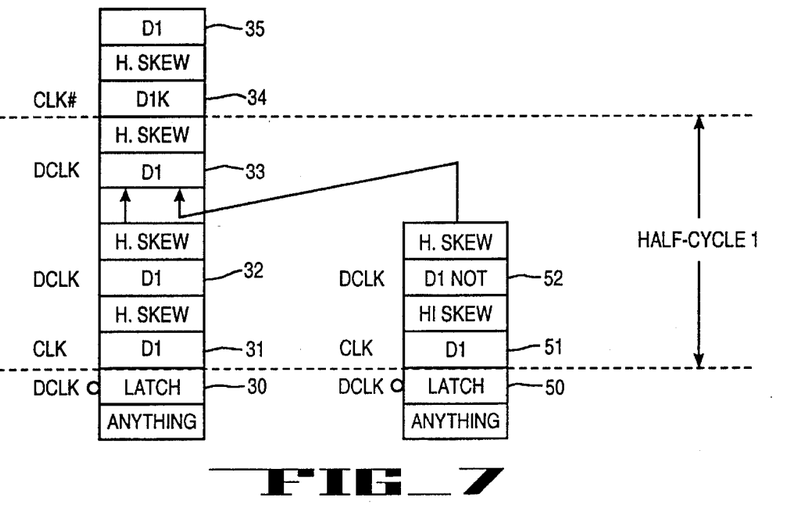
FIG. 7 is a pipeline example illustrating opportunistic time-borrowing in accordance with one embodiment of the present invention.

Another potential problem arises if a domino gate controlled by DCLK has an input from a CLK-controlled gate. In this situation, opportunistic time-borrowing may be inhibited. FIG. 7 illustrates one solution to this problem. FIG. 7 illustrates domino pipeline comprising gates 31–35 wherein gate 33 receives two inputs: one coupled from the output of gate 32, and another coupled from the output gate 51. In the absence of the domino buffer, comprising gate 52 followed by a high skew inverter, gate 33 would be prevented from borrowing time if gate 32 finished late. The reason for this is that its other input from gate 51 will have precharged. By adding domino buffer gate 52, both inputs to gate 33 remain stable, so that gate 33 can now borrow time. Note that buffer 52 is not in a critical path.

Returning now to the example of FIG. 5, several guidelines for the composition of the types of domino gates employed in half-cycle stages will be discussed. In FIG. 5, half-cycle 1 begins with domino gate 31, which is the D1 gate illustrated in FIG. 1. The D1 gate is controlled by CLK, and then has one or more D1 stages controlled by DCLK. The reason why a D1-type of domino gate is used as the first gate in the first half-cycle is that at this point in the pipeline there is no concern about holding the input value since the input is provided by latch 30. (Note that wherever possible, it may be preferred to utilize the D1-type of domino gate rather than the D1K gate since the D1 gate has one fewer transistor.)

Subsequent odd-numbered half-cycles begin with a D1K-type of gate controlled by CLK, followed by one or more D1 gates controlled by DCLK. Even-numbered half-cycles begin with a D1K-type of gate controlled by CLK# followed by one or more D1 gates controlled by DCLK#. Use of the D1K-type of domino gate obviates the need for latching the input data to each half-cycle. As always, between each domino logic gate there is one inverting high skew CMOS gate.

Figure 8:
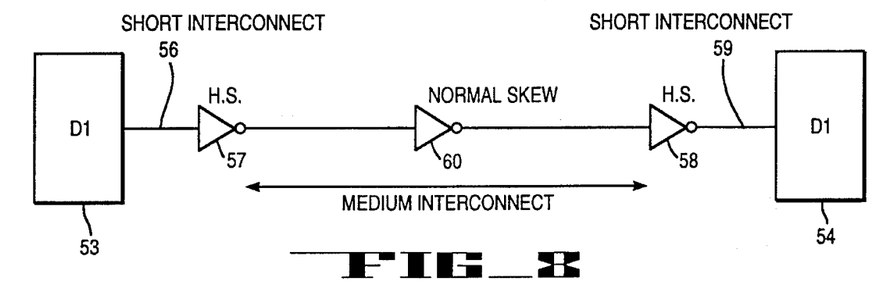
FIG. 8 is a circuit diagram illustrating a circuit interconnect scheme in accordance with the present invention.

Because domino logic gates ordinarily are sensitive to capacitive coupling noise, domino methodology should compensate for situations in which relatively long interconnects are required between successive domino gates. To combat this problem, FIG. 8 illustrates the use of a repeater 60 for coupling successive domino gates separated by a relatively long distance. Domino gate 53 is shown being coupled to high skew gate 57 via short interconnect 56. Likewise, short interconnect 59 couples the output of high skew gate 58 to the input of domino logic gate 54. In the example of FIG. 8, high skew gate 57 shields the sensitive output of domino gate 53 and drives the beginning of the longer interconnect. Inverter 60 acts as a repeater, and high skew gate 58 shields the sensitive input of final domino gate 54.

It is appreciated that more than one repeater may be used for longer interconnects so long as the total number of inversions between domino gates remains odd. Additionally, a low-skew repeater may also be used for faster evaluation time at the expense of slower propagation of the precharge edge over a moderately long interconnect. Further, it is understood that gates 51, 58, and 60 do not have to be inverters; they may be any inverting logic function. Finally, it should be understood that very long interconnects cannot be driven in a single cycle; this necessitates a latching scheme.

Figure 9A:
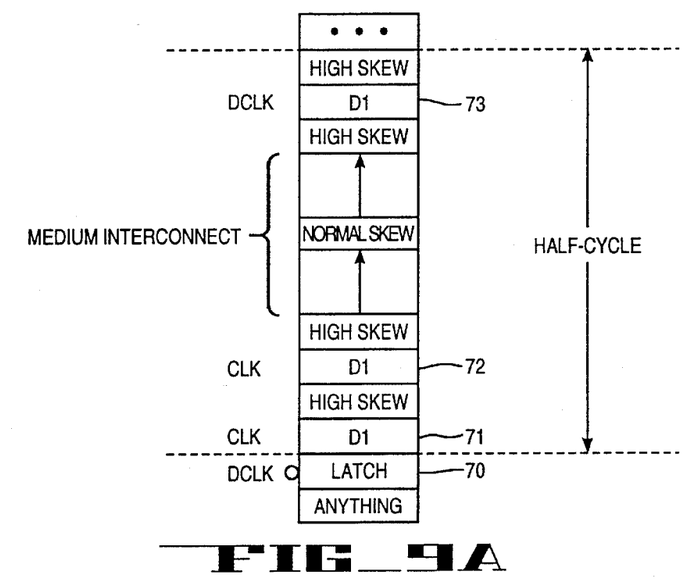
FIG. 9A is a domino pipeline example implemented for a particular interconnect scheme in accordance with one embodiment of the present invention.
Figure 9B:
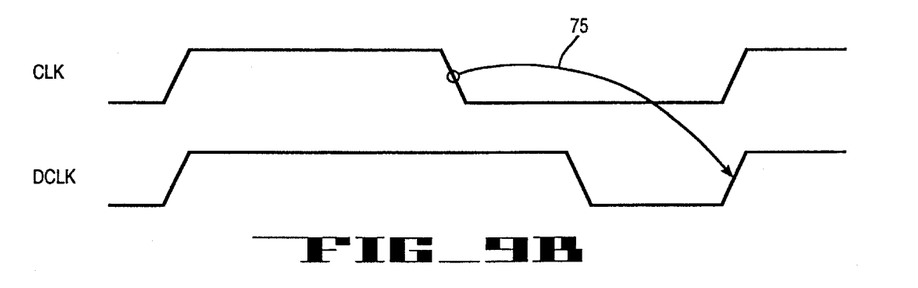
FIG. 9B illustrates timing waveforms for the example of FIG. 9A.

FIG. 9A illustrates another example involving a relatively long interconnect between domino gates. The example of FIG. 9 shows domino gate 72 being coupled to domino gate 73 via a relatively long interconnect within a half-cycle. In this situation, the driving domino gate 72 is controlled by CLK (or CLK#) and the receiving domino gate is controlled by CLK (or CLK#) or DCLK (or DCLK#). In this case, half of the clock period is available for precharge of the domino gate and transitioning of the entire bus—including the high skew gate at the beginning, the repeater in the middle, and the high skew gate at the end. This is shown in the corresponding timing waveform diagram of FIG. 9B. Arrow 75 in FIG. 9B illustrates that the precharge time available from domino gate 72 to gate 73 is equal to one-half of a clock period.

Figure 10A:
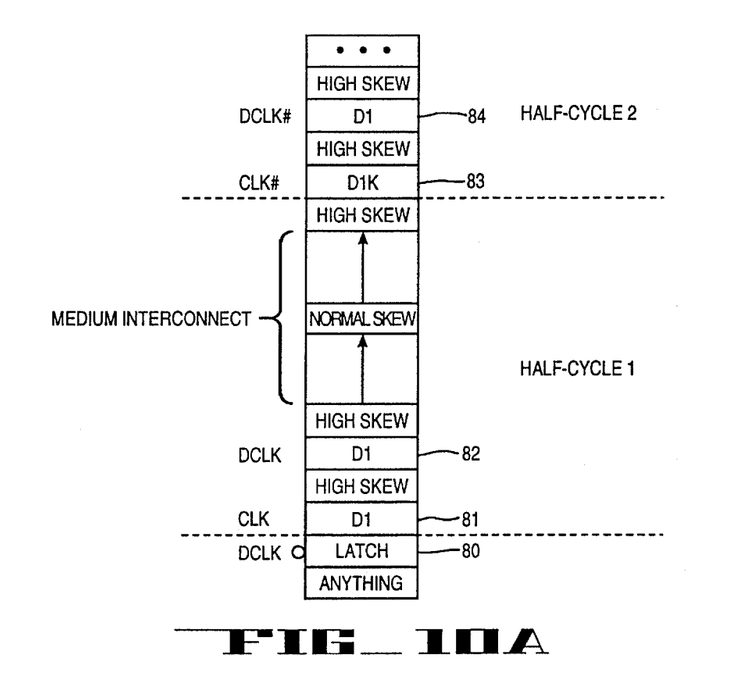
FIG. 10A represents another example of implementation of the present invention.
Figure 10B:
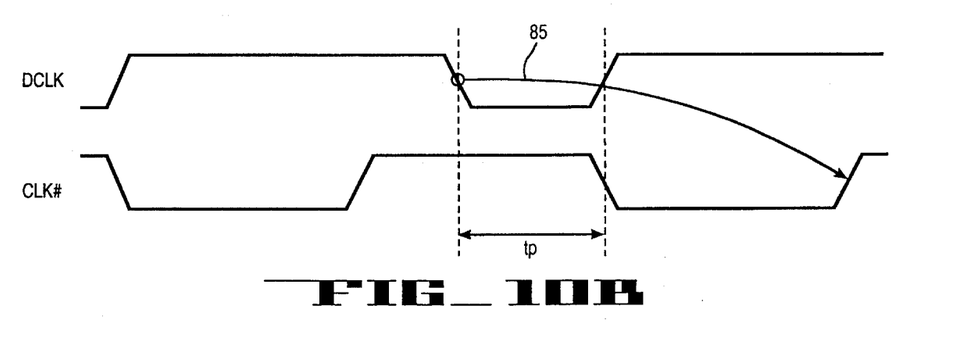
FIG. 10B illustrates timing waveforms corresponding to the example of FIG. 10A.

FIG. 10A illustrates a situation in which a relatively long interconnect occurs at the end of a half-cycle driving a gate in the subsequent half-cycle. In this case, logic gate 82 of half-cycle 1 drives logic gate 83 at the beginning of half-cycle 2, via a relatively long interconnect. Domino gate 82 is controlled by DCLK (or DCLK#) and the receiving domino logic gate 83 is controlled by CLK# (or CLK). Clocking the gates in this manner means that half of the clock period plus a precharge time ($=T+t_p$) is available for precharge of the domino gate and transitioning of the entire bus—including the high skew gate at the beginning, the repeater in the middle, and the high skew gate at the end. FIG. 10B illustrates the timing waveforms corresponding to the example of FIG. 10A. Arrow 85 shows that the precharge from gate 82 to 83 comprises time $t_p+\frac{1}{2}$ of a clock cycle. These examples should make practitioners in the art realize it is preferable to place relatively longer interconnects at the end of the half-cycle to maximize precharge time.

Interfacing To The Domino Logic Pipeline

Figure 11:
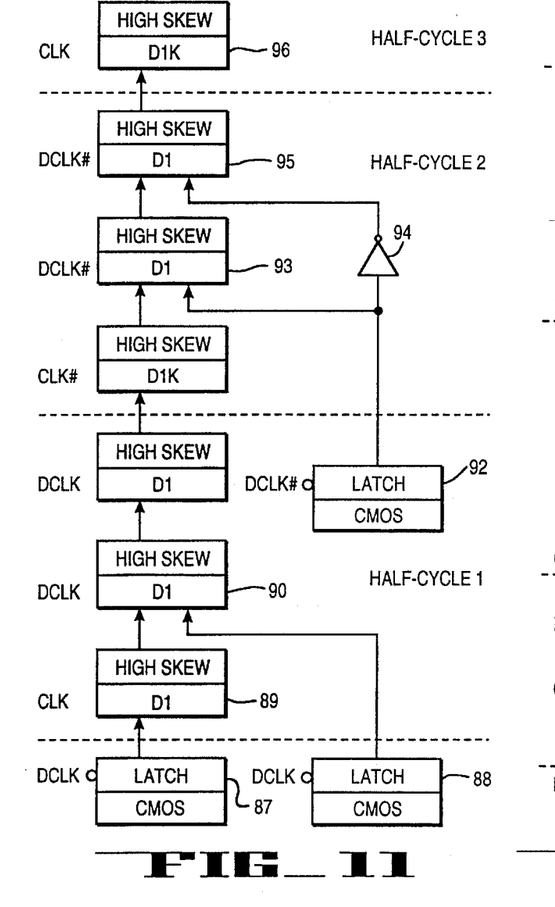
FIG. 11 is an example showing how static inputs may be interfaced to domino inputs in accordance with the present invention.

At the inputs to the pipeline, the domino logic methodology of the present invention requires that static logic be latched to prevent glitches from accidentally triggering the domino gates. FIG. 11 is a diagram illustrating an example of proper connection of static inputs to the domino logic pipeline of the present invention. The diagram of FIG. 11 shows latch 87 providing an input to domino gate 89; latch 88 providing an input to domino gate 90; and latch 92 providing inputs to domino gates 93 and 95. The connection to domino gate 95 is shown through inverter 94. All of the latches shown in FIG. 11 are transparent when their clock input is low.

Inputs to a domino gate should come either from other domino gates or from a latch that is transparent when the domino gate is precharging. The latch should also be located physically near to, and connected to the same power supply, as the domino gate to reduce ground noise problems. The latch should also be characterized as having a longer setup time when driving domino gates to ensure that the output has time to fall below the triggering threshold before evaluation begins. This latter guideline implies that the setup time of the latch driving domino is dependent on the input slope as well as on the time the input crosses the 50% level.

In some cases, a latch may fan out to many different domino gates in different functional unit blocks, making it virtually impossible to place the latch physically near to all of the domino gates. One solution to this problem is to employ many latches—one near each domino gate which requires the same input signal. Another solution is to place a domino buffer immediately after the latch, then run a relatively long interconnect from the buffer to all of the fanouts. FIG. 11 further illustrates the use of an inverter 94 for passing a static input to domino logic gate 95. In this case, the static input should be in series with the domino input and should arrive more than the delay time of the static gate 94 prior to the earliest time the domino gate 95 could evaluate.

Figure 12:
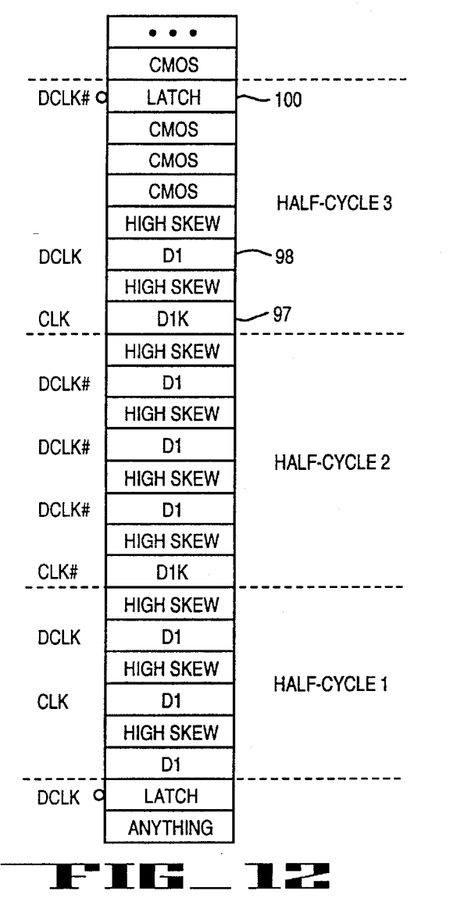
FIG. 12 is an example showing how domino pipeline outputs may be latched in accordance with the present invention.

Outputs of a domino pipeline should be latched before the end of the half-cycle to prevent the precharge of the domino gate from propagating through the CMOS logic and overriding valid data. FIG. 12 illustrates one scheme for latching outputs in accordance with the present invention in which a final stage connects to CMOS circuitry. In this final stage, D1K gate 97 is controlled by CLK (or CLK#) and is followed by a domino gate 98 controlled by DCLK (or DCLK#). The gates following logic gate 98 may be either domino or ordinary CMOS gates. The final element is a two-phase latch controlled by DCLK# (or DCLK), as shown by latch 100. Note that latch 100 would also function correctly if controlled by CLK# (or CLK).

We claim:

1. A domino circuit comprising:
   a plurality of logic gates coupled in series and controlled by first, second, third and fourth clock signals, the second clock signal being an inverse of the first clock signal, the third and fourth clock signals having rising edges substantially synchronous with rising edges of the first and second clock signals and falling edges delayed with respect to falling edges of the first and second clock signals, respectively;
   the plurality of logic gates being organized into N groups, where N is an integer greater than one, each of the N groups comprising a first logic gate and at least one remaining gate;
   the first logic gates of odd-number groups being controlled by the first clock signal, and the at least one remaining logic gate of the odd-number groups being controlled by the third clock signal; the first logic gates of even-numbered groups being controlled by the second clock signal and the at least one remaining logic gate of the even-numbered groups being controlled by the fourth clock signal.

2. The domino circuit of claim 1 wherein each of the N groups comprises two or more pairs of logic gates, each pair comprising a domino gate of either a first or second type connected to a high skew gate.

3. The domino circuit of claim 2 wherein the first logic gate of each of groups 2 through N comprise the second type of domino gate.

4. The domino circuit of claim 3 wherein the first logic gate of group 1 comprises the first type of domino gate.

5. The domino circuit of claim 4 wherein the at least one remaining logic gates of the N groups comprise the first type of domino gate.

6. The domino circuit of claims 2, 3, 4 or 5 wherein the second type of domino gate has at least one data input, a clock input, and data output, and further comprises:
   a p-channel field-effect transistor (PFET) coupled between a first operating potential and the output;
   a first and a second n-channel field-effect transistor (NFET) coupled in series between the PFET and a second operating potential, the gates of the PFET and the second NFET being coupled to the clock input, and the gate of the first NFET being coupled to the at least one data input;

first and second inverters coupled in series, the input of the first inverter and the output of the second inverter being coupled to the data output of the second type of domino gate such that data is retained at the data output irrespective of the clock input.

7. The domino circuit of claim 6 wherein the first type of domino gate has at least one data input, a clock input, and a data output, and further comprises:

first and second PFETs coupled in parallel between the first operating potential and the data output;

first and second NFETs coupled in series between the PFETs and the second operating potential, the gates of the first PFET and second NFET being coupled to the clock input, and the gate of the first NFET being coupled to the at least one data input;

an inverter having its input coupled to the data output and its output coupled to the gate of the second PFET.

8. The domino circuit of claim 7 further comprising a static latch holding input data, the static latch having an output coupled to the first logic gate of the group one logic gates, the static latch being controlled by the first or third clock signal.

9. The domino circuit of claim 7 wherein the odd-numbered groups evaluate when the first clock signal is logically high, and the even-numbered groups evaluate when the first clock signal is logically low.

10. The domino circuit of claim 9 wherein the high skew gate comprises an inverting CMOS gate.

11. The domino circuit of claim 8 further comprising at least one additional latch coupling corresponding static inputs to a Mth group of the domino circuit, where M is an integer ranging from 2 to N, the at least one additional latch being controlled by the clock signal which controls the at least one remaining logic gates of the M−1 group of logic gates.

12. The domino circuit of claim 1 further comprising an output latch holding data from the Nth group, the output latch being controlled by either the second or fourth clock signals.

13. The domino circuit of claim 12 wherein the output latch comprises a two-phase latch connected to CMOS circuitry.

14. The domino circuit of claim 1 wherein the first and second clock signals have approximately a 50% duty cycle.

15. An integrated circuit (IC) comprising:

a domino pipeline;

a global clock signal;

a local clock generator coupled to receive the global clock signal and generate first, second, third and fourth clock signals therefrom, the first, second, third and fourth clock signals being provided to the domino pipeline which comprises:

a plurality of logic gates coupled in series and controlled by the first, second, third and fourth clock signals, the second clock signal being an inverse of the first clock signal, with the third and fourth clock signals having rising edges substantially synchronous with rising edges of the first and second clock signals and falling edges delayed a predetermined period with respect to falling edges of the first and second clock signals, respectively;

the plurality of logic gates being organized into N groups, where N is an integer greater than one, each of the N groups comprising a first logic gate and at least one remaining gate;

the first logic gates of odd-numbered groups being controlled by the first clock signal, and the at least one remaining logic gate of the odd-numbered groups being controlled by the third clock signal; the first logic gates of even-numbered groups being controlled by the second clock signal and the at least one remaining logic gate of the even-numbered groups being controlled by the fourth clock signal.

16. The IC of claim 15 wherein each of the N groups comprises two or more pairs of logic gates, each pair comprising a domino gate of either a first or a second type connected to a high skew gate.

17. The IC of claim 16 wherein the first logic gate of each of groups 2 through N comprise the second type of domino gate.

18. The IC of claim 17 wherein the odd-numbered groups evaluate when the first clock signal is logically high and the even-numbered groups evaluate when the first clock signal is logically low.

19. The IC of claim 18 wherein the high skew gate comprises an inverting CMOS gate.

20. The IC of claim 15 further comprising an output latch holding output data from the Nth group, the output latch being controlled by either the second or fourth clock signals.

21. The IC of claim 20 further comprising at least one additional latch coupling static inputs to a Mth group of the plurality of logic gates, where M is an integer ranging from 2 to N, the at least one additional latch being controlled by the clock signal which controls the at least one remaining logic gate of the M−1 group of logic gates.

22. The IC of claim 20 wherein the output latch comprises a two-phase latch connected to CMOS circuitry.

23. The IC of claims 15, 16, 17, 18, 19, 20, 21 or 22 wherein the first and second clock signals have approximately a 50% duty cycle.

24. The IC of claim 23 wherein the first logic gate of group 1 comprises the first type of domino gate.

25. The IC of claim 24 wherein the at least one remaining logic gate of the N groups comprises the first type of domino gate.

26. The IC of claim 25 wherein the second type of domino gate has at least one data input, a clock input, and a data output, and further comprises:

a p-channel field-effect transistor (PFET) coupled between a first operating potential and the output;

a first and a second n-channel field-effect transistor (NFET) coupled in series between the PFET and a second operating potential, the gates of the PFET and second NFET being coupled to the clock input, and the gate of the first NFET being coupled to the at least one data input;

first and second inverters coupled in series, the input of the first inverter and the output of the second inverter being coupled to the data output of the second type of domino gate such that data is retained at the data output irrespective of the clock input.

27. The IC of claim 26 wherein the first type of domino gate has at least one data input, a clock input, and a data output, and further comprises:

first and second PFETs coupled in parallel between the first operating potential and the data output;

first and second NFETs coupled in series between the PFET and a second operating potential, the gates of the first PFET and second NFET being coupled to the clock input and the gate of the first NFET being coupled to the at least one data input; and an inverter having its input coupled to the data output and its output coupled to the gate of the second PFET.

28. The IC of claim 27 further comprising an input latch holding input data, the input latch having an output coupled to the first logic gate of the around 1 logic gates, wherein the input latch is controlled by the third clock signal.

29. The IC of claim 16 wherein the predetermined period is greater than or equal to the sum of a hold time associated with either the first or second type of domino gate plus a skew associated with the global clock signal.

30. The IC of claim 29 wherein a period of the first clock signal minus the predetermined period is greater than or equal to a worst case precharge time for either the first or second domino gates plus a local skew of either the first, second, third or fourth clock signals.

31. An integrated circuit (IC) which includes an opportunistic time-borrowing domino logic circuit, the integrated circuit comprising:

a clock generator for generating first, second, third and fourth clock signals;

a domino pipeline comprising a plurality of logic gates controlled by the first, second, third and fourth clock signals, the logic gates being coupled in series and grouped according to half-cycles;

a first domino gate in a half-cycle being clocked by either the first or second clock cycles, a last domino gate in the half-cycle being clocked by either the third or fourth clock signals, if an input to any domino gate originates from a domino gate of a previous half-cycle, then all other inputs in series with the input originate from either a domino gate or a static latch of the previous half-cycle; the domino gates being either a first or a second type wherein a first half-cycle begins with a first domino gate of the first type controlled by the first clock signal, followed by one or more domino gates of the first type controlled by the third clock signal; and wherein subsequent odd-numbered half-cycles begin with a first domino gate of the second type controlled by the second clock signal, followed by one or more domino gates of the first type controlled by the fourth clock signal.

32. The IC of claim 31 further comprising a plurality of inverting high skew gates, each inverting high skew gate being interposed between successive domino gates.

33. The IC of claim 32 wherein the second clock signal comprises an inverse of the first clock signal, the third and fourth clock signals having rising edges substantially synchronous with rising edges of the first and second clock signals and falling edges delayed with respect to falling edges of the first and second clock signals, respectively.

34. The IC of claim 33 wherein the first clock signal has a duty cycle which is approximately 50%.

* * * * *

UNITED STATES PATENT AND TRADEMARK OFFICE
CERTIFICATE OF CORRECTION

PATENT NO. : 5,517,136
DATED : May 14, 1996
INVENTOR(S) : Harris et al.

It is certified that error appears in the above-identified patent and that said Letters Patent is hereby corrected as shown below:

In column 3 at line 24 delete "fellows" and insert --follows--

In column 13 at line 7 delete "around" and insert --group--

Signed and Sealed this

Thirty-first Day of December, 1996

*Attest:*

BRUCE LEHMAN

*Attesting Officer*     *Commissioner of Patents and Trademarks*